United States Patent

Hekimian

[15] 3,703,686

[45] Nov. 21, 1972

[54] PHASE LOCK LOOP AND FREQUENCY DISCRIMINATOR EMPLOYED THEREIN

[72] Inventor: Norris C. Hekimian, Rockville, Md.

[73] Assignee: Hekimian Laboratories, Inc., Rockville, Md.

[22] Filed: Sept. 17, 1971

[21] Appl. No.: 181,434

[52] U.S. Cl. ......................331/11, 307/216, 328/39, 328/133, 331/33, 331/135

[51] Int. Cl. ..............................................H03b 3/04

[58] Field of Search..................................331/11, 33

*Primary Examiner*—John Kominski

*Attorney*—Rose & Edell

[57] ABSTRACT

A phase lock loop employs a frequency discriminator having a relatively slow response to pull a voltage controlled oscillator into frequency lock with an input signal. After frequency lock the output of the frequency discriminator is nulled and a phase detector becomes effective to maintain phase lock. The frequency discriminator utilizes an operational amplifier to which both the input and oscillator signals are capacitively coupled through respective oppositely poled diode gates. A feedback capacitor, which is much larger than the input coupling capacitors, has charge transferred thereto fro m each coupling capacitors during alternate half cycles of the input and oscillator signals. The net charge across the feedback capacitor is a measure of the frequency difference between the input and oscillator signals, and is zero at frequency lock.

10 Claims, 7 Drawing Figures

INVENTOR
NORRIS C. HEKIMIAN

BY Rose & Edell
ATTORNEYS

INVENTOR
NORRIS C. HEKIMIAN

BY Rose & Edell
ATTORNEYS

PHASE LOCK LOOP AND FREQUENCY DISCRIMINATOR EMPLOYED THEREIN

BACKGROUND OF THE INVENTION

The present invention relates to frequency and phase control of electrical signals and, more particularly, to a novel frequency discriminator which may be employed in a novel phase lock loop to permit a lock capability over a wide frequency range.

It is known in the prior art that a frequency discriminator can be employed in conjunction with a phase detector in a phase lock loop to permit phase lock to be achieved over a wide range of input signal frequencies. The frequency discriminator operates to provide an error signal as a function of the frequency difference between the input signal and a voltage controlled oscillator (VCO), the error signal being employed to control the VCO frequency. When the loop, with the aid of the frequency discriminator, attains frequency lock, the phase detector takes control to maintain phase lock. Phase lock loops of the type described usually suffer from an undesirable sensitivity to frequency transients in the input signal. Specifically, once frequency lock has been attained in the loop, sudden frequency transients in the input signal cause the frequency discriminator to inject a relatively large error signal into the loop. The large error signal changes the VCO frequency to drive the loop out of lock. The few systems which have solved this problem have required unduly complex circuitry to inhibit the frequency discriminator once frequency lock has been attained.

An example of a prior art phase lock loop employing a frequency discriminator may be found in U.S. Pat. No. 3,308,387 to Hackett. Hackett utilizes two VCO's, one controlled by a frequency discriminator and the other controlled by a phase detector. The first VCO is maintained by the frequency discriminator at a fixed frequency difference from the input signal frequency. The second VCO has a nominal frequency equal to the difference between the frequencies of the first VCO and the input signal. Mixing of the two VCO signals results in a frequency approximately equal to that of the input signal. Conventional phase lock circuitry then controls the second VCO to assure a constant phase relationship with the input signal. In this manner Hackett utilizes what amounts to two loops, with a frequency loop feeding the phase lock loop. This permits the frequency lock loop to be provided with a slow transient response and thereby avoid driving the phase lock loop out of lock whenever sudden transients in the input signal frequency occur. However, in order to achieve this result Hackett is forced to resort to two VCO's and additional mixing and filtering circuits.

Another approach to utilizing a frequency detector for wide frequency range operation in a phase lock loop is disclosed in U.S. Pat. No. 3,458,823 to Nordahl. In his patent Nordahl discloses a frequency detector followed by separate filter and gating circuitry which acts to inhibit to output signal from the frequency detector after frequency lock has been attained. In this way the relatively large output signals produced by the frequency detector in response to input signal frequency transients is prevented from driving the phase lock loop out of lock. The additional circuitry required to achieve this result renders Nordahl's phase lock loop relatively complex and expensive.

It is therefore an object of the present invention to provide a phase lock loop which utilizes a frequency discriminator to attain frequency lock over a wide range of input signals yet which automatically removes itself from effective operation within the loop after frequency lock has been attained.

It is another object of the present invention to provide a relatively simple phase lock loop operable over a wide frequency range yet which is insensitive to frequency transience.

It is another object of the present invention to provide a frequency discriminator for primary, although not total, utilization in a phase lock loop and having the characteristics of providing a null output signal at frequency lock and a relatively slow response to frequency transience.

SUMMARY OF THE INVENTION

In accordance with the present invention a wide range phase and frequency lock loop employs a perfect integrator loop filter and a frequency controlled discriminator to avoid false lock conditions. The frequency discriminator utilizes an operational amplifier having a feedback capacitor and a pair of input coupling capacitors for respective input signals. Each input signal path is controlled by its own diode gate which causes the input coupling capacitor to charge during one half cycle of the input signal and to transfer that charge to the feedback capacitor during the other half cycle of the input signal. The gates for the two input signals are oppositely poled so that the charge transferred to the feedback capacitor from one coupling capacitor is of opposite polarity to the charge transferred to the feedback capacitor from the other coupling capacitor. The net charge across the feedback capacitor represents the frequency difference between the two input signals. When the two input signal frequencies are equal the net charge across the feedback capacitor is zero and the resulting output signal from the frequency discriminator is zero. When utilized in a phase lock loop this frequency discriminator thus automatically biases itself off after the loop attains frequency lock. The feedback capacitor is relatively large as compared to the coupling capacitors to that only a small charge transfer occurs during each cycle. The transient response of the discriminator is therefore very slow and input signal frequency transients have little or no effect on the discriminator output signal.

The phase lock loop of the present invention also employs novel bistable circuits, a novel VCO, and a novel phase detector, each utilizing single operational amplifiers.

BRIEF DESCRIPTION OF THE DRAWINGS

The above and still further objects, features and advantages of the present invention will become apparent upon consideration of the following detailed description of specific embodiments thereof, especially when taken in conjunction with the accompanying drawings, wherein.

DESCRIPTION OF THE PREFERRED EMBODIMENTS

Figure 1:
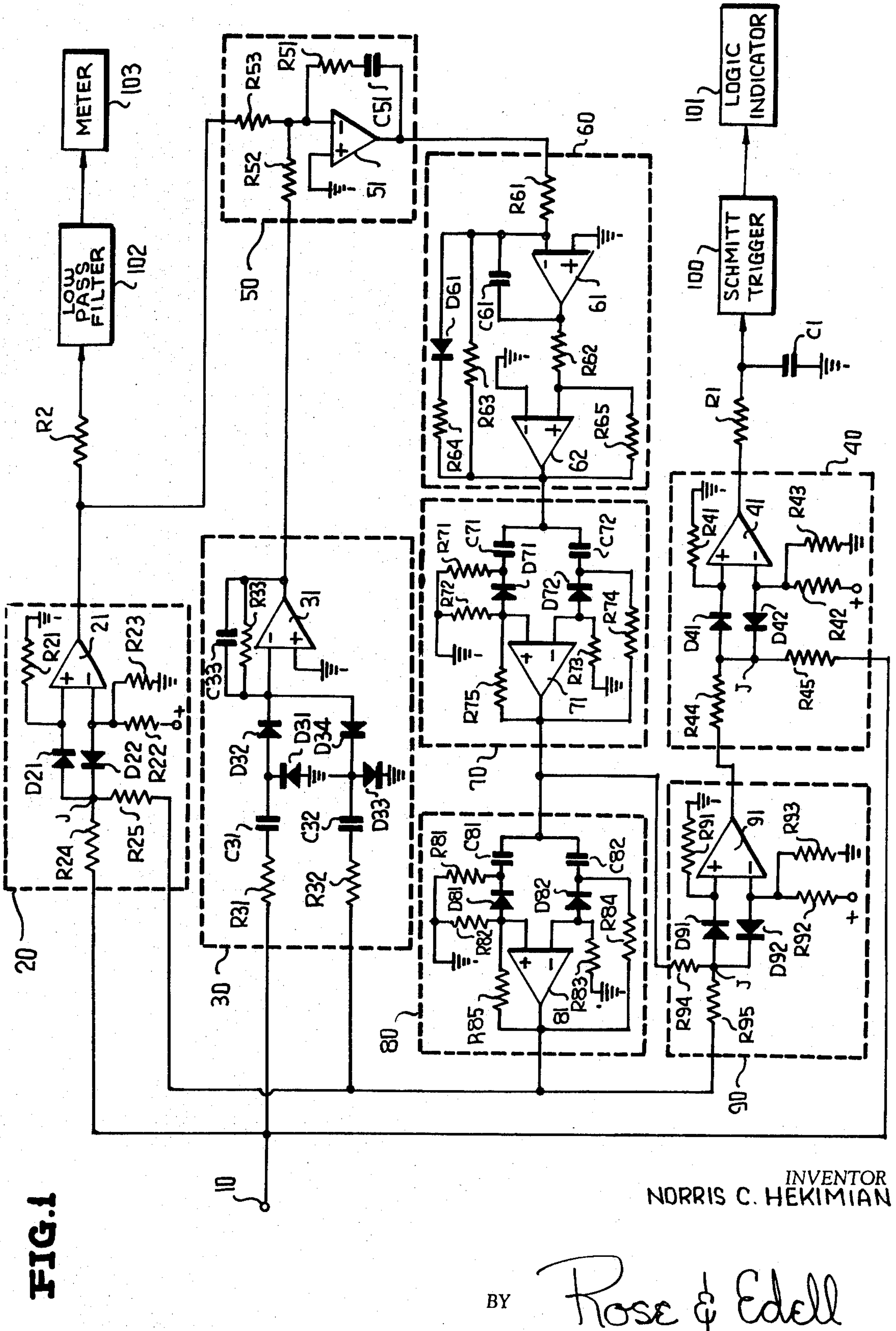
FIG. 1 is a schematic diagram of the overall phase lock loop of the present invention.

Referring specifically to FIG. 1 of the accompanying drawings, a phase lock loop includes an input terminal 10 which receives the input signal to which the loop is to be phase and frequency locked. It is assumed that the input signal is a rectangular wave and is passed through a squaring circuit (not shown) before application to terminal 10 to attain the rectangular wave form. The input signal is applied from terminal 10 to each of a phase detector 20, a frequency discriminator 30, and exclusive OR gate 40. The output signals from phase detector 20 and frequency discriminator 30 are combined in a loop filter 50 which in turn drives a VCO 60. The output signal from the VCO drives a bistable circuit 70 which in turn drives a second bistable circuit 80, the output signal from which is thus one quarter the frequency of the output signal from VCO 60. The output signal from bistable circuit 80 is applied to both the phase detector 20 and frequency discriminator 30 where it is compared with the input signal applied to terminal 10. the output signal from bistable circuit 80 is also supplied to an exclusive OR gate 90 along with the output signal from bistable circuit 70. The phase of the output signal from exclusive OR gate 90 is shifted 90° from the output signal from bistable circuit 80 and is applied as a second input signal to exclusive OR gate 40. The latter circuit feeds a low pass filter comprising series resistor R1 and parallel capacitor C1 to drive a Schmitt trigger circuit 100. The latter drives a logic indicator 101 which indicates when the loop is in phase and frequency lock condition.

The output signal from phase detector 20 is applied through a resistor R2 to a low pass filter 102 and in turn to a meter 103 which indicates the phase difference between the VCO signal and the input signal.

Examining each of the loop components in detail, phase detector 20 includes an operational amplifier 21, which by way of example may comprise one half of Motorola Corporation Model MC1437. The non-inverting input terminal (+) of amplifier 21 is referenced to ground through resistor R21 and is connected to the cathode of diode D21. The inverting input terminal (−) of amplifier 21 is connected to the anode of diode D22 and to each of resistors R22 and R23. R23 is referenced to ground and R22 is referenced to a positive DC voltage source. The anode of diode D21 and the cathode of diode D22 are connected together at common junction J to which additional resistors R24 and R25 are connected. R24 serves to couple the input signal from terminal 10 to common junction J; R25 serves to couple the output signal from bistable circuit 80 to junction J.

Phase detector 20 in essence operates as an exclusive OR circuit. Specifically, if both input signals are positive diode D21 is forward biased and diode D22 is back biased. As a consequence a positive signal is applied only to the non-inverting input terminal (+) and a high positive signal, at the saturation level of the operational amplifier, is provided at the output terminal of the amplifier. Likewise, if both input signals are negative, diode D21 is back-biased while D22 is forward biased and a negative signal appears at the inverting input terminal of amplifier 21. This is inverted and once again a high level output signal is provided by amplifier 21.

If the two input signals are approximately equal in magnitude but opposite in polarity, a low level (negative) output signal is provided by amplifier 21. Specifically, the voltage at junction J is approximately zero and a positive bias voltage is applied to the inverting input terminal (−) via resistor R22. Even if both of diodes D21 and D22 are forward biased by the positive bias voltage, the voltage at non-inverting terminal (+) must be lower than that applied to the inverting terminal (−). Consequently the amplifier inverts the positive signal applied to its inverting input terminal to provide a saturated low or negative output level.

Exclusive OR circuits 40 and 90 are identical to phase detector 20. For ease in reference, the reference characters designating components in circuit 40 are the same as those employed in circuit 20 with the exception that a "4" is utilized for components of circuit 40 in the decade column; similar components in circuit 90 utilize a "9" in the decade column.

Referring now to frequency discriminator 30, an operational amplifier 31, for example one half of Motorola Corporation Model MC1458, has its non-inverting input terminal (+) grounded. The inverting input terminal (−) is connected to a common junction P. Feedback to junction P from the output terminal of amplifier 31 is effected through parallel connected resistor R33 and capacitor C33. Input signal to junction P is effected via two paths. A first path is utilized for the input signal from terminal 10 and includes a resistor R31, a capacitor C31, and a diode D32 connected in series between terminal 10 and junction P. Diode 32 is poled to conduct positive current toward junction P. A further diode D31 has its cathode connected to a point between capacitor C31 and diode D32 and has its anode connected to ground. A second signal path to junction P is for the output signal from bistable circuit 80 and includes series connected resistor R32, capacitor C32, and diode D34. Diode D34 is poled to conduct negative current to junction P. A further diode D33 has its anode connected to a point between capacitor C32 and diode D34, and has its cathode grounded.

The operation of frequency discriminator 30 relies on the well known fact that an operational amplifier provides a zero voltage at its input terminal, in this case at junction P. This characteristic of amplifier 31 serves to isolate the two input circuit paths connected to junction P. Thus, assuming equal amplitude rectangular wave input signals on both of the input lines, during the negative half cycle of the loop input signal, diode D31 is forward biased and diode D32 is back biased. Capacitor C31 charges from right to left as illustrated in FIG. 1. During positive half cycles of the input signal, diode D31 is back-biased and diode D32 is forward biased so that the charge accumulated on capacitor C31 is transferred to feedback capacitor C33.

The signal from bistable circuit 80 is processed at frequency discriminator 30 in a complementary manner. Specifically during positive portions of the signal cycle diode D34 is back biased and diode D33 is forward biased. Capacitor C32 therefore charges from left to right as viewed in FIG. 1. During negative portions of the signal cycle diode D33 is back biased and diode D34 is forward biased so that the charge on capacitor C32 is transferred to feedback capacitor C33. Importantly, capacitors C31 and C32 charge in opposite directions relative to feedback capacitor C33. Consequently the net charge appearing across feedback capacitor C33 is a measure of the difference in frequency between the two signals applied to discriminator 30. For operation in a phase lock loop of the type described, capacitor C33 is preferably much larger than each of capacitors C31 and C32. For example, C33 may be 0.15 microfarads whereas C31 and C32 may be .001 microfarad. Under these conditions, each cycle of transfer causes only a small voltage change across capacitor C33. Thus, only a frequency difference between the input signals subsisting over a relatively large number of cycles produces a significant change in the voltage across feedback capacitor C33. For the sample values stipulated above, there is a 150 to 1 ratio in capacitance between C33 and C31, C32. Therefore, less than 1 percent of the voltage difference between C31 or C32 and C33 is transferred in any cycle. The time required for transfer is limited only by the operational amplifier capability. Series resistance (R31, R32) in the input lines has little effect so long as the time constant such resistance produces with C31 and C32 is well under half a period of the input signal. Symmetry of the input signal lines is also unimportant so long as the charge and discharge time constants are also under a half period.

For best operation the peak-to-peak amplitude of both input signals to the discriminator should be equal, although absolute level of either input signal is immaterial due to the coupling capacitors C31 and C32. Differences in peak-to-peak amplitude between the two input signals cause direct error but may be corrected by changing the ratio of C31 to C32, or by trimming the input amplitude via an attenuator or divider circuit.

An important feature of discriminator 30 when utilized in the phase lock loop of FIG. 1 is the fact that at phase lock the output signal from the discriminator is a true null and is independent of phase of the two input signals. The true null, combined with the slow transient response effected by the ratio of C33 to both C31 and C32, renders the discriminator self-inhibiting once frequency lock has been attained in the loop. Moreover, since the output signal of the discriminator is independent of the relative phases of the input signals, there is no interaction between the frequency discriminator and the phase detector. This assures that the frequency discriminator has control over the loop prior to frequency lock and that the phase detector has complete control once frequency lock has been attained.

It is important to note that the center frequency of frequency discriminator 30 is not fixed at some arbitrary value; rather, the center frequency is always that of the output signal from bistable circuit 80 which in turn is one-quarter the frequency of VCO 60. This feature permits the discriminator to have an output null at frequency lock, whereas discriminators with a fixed center frequency provide a standing output signal at frequency lock if the lock frequency does not happen to coincide with the center frequency of the discriminator.

Resistor R33 is provided in parallel with capacitor C33 to prevent the latter from obtaining initial charge. In this respect it forms a low pass filter with the feedback capacitor to prevent the operational amplifier circuit from operating as a perfect integrator. Thus the discriminator, by virtue of this low pass filter, has a low input signal frequency limit below which charge is not effectively transferred to capacitor C33.

Loop filter 50 is basically a "perfect integrator" type filter which employs an operational amplifier 51 having a series negative feedback path comprising storage capacitor C51 and resistor R51. Signals from phase detector 20 and frequency discriminator 30 are applied to the loop filter via respective series resistors R53 and R52 and are summed at the inverting input terminal (−). The purpose of filter 50 is to smooth the voltages provided by phase detector 20 and frequency discriminator 30 and to provide a DC control voltage for the purpose of controlling the frequency of VCO 60. The output signal from frequency discriminator 30, when the loop is out of frequency lock, is significantly larger than the maximum output signal provided by phase detector 20. Thus, prior to frequency lock, the frequency discriminator dominates filter 50 and provides a relatively large DC correction signal to VCO 60. After frequency lock has been attained, the output signal from the frequency discriminator is substantially zero and the relatively low level output signal from the phase detector 20 dominates the filter. VCO 60 receives the control signal from filter 50 through resistor R61 connected in series with the inverting input terminal of an operational amplifier 61. A negative feedback capacitor C61 is connected between the output terminal of amplifier 61 and its inverting input terminal. The output signal from amplifier 61 is connected through series resistor R62 to the non-inverting input terminal of a second operational amplifier 62. The non-inverting input terminal of amplifier 61 and the inverting input terminal of amplifier 62 are grounded. Resistive positive feedback for amplifier 62 is effected by resistor R65 connected between the output terminal and non-inverting input terminal of amplifier 62. A feedback circuit between output terminal of amplifier 62 and the inverting input terminal of amplifier 61 consists of a resistor R63 connected in parallel with the series combination of resistor R64 and diode D61. Diode D61 has its anode connected to the inverting input terminal of amplifier 61.

Amplifier 61 operates as an integrator whose output signal is a saw tooth wave. This signal is fed to amplifier 62 which is connected for operation as a Schmitt trigger. The output signal from amplifier 62 assumes either a heavily negative or a heavily positive voltage depending upon the switching state of the amplifier. When the output signal from amplifier 62 is heavily negative resistors R63 and R64 are both included in the charging circuit for capacitor C61. When the output signal from amplifier 62 is heavily positive, diode D61 is back-biased, eliminating resistor R64 from the charging circuit of capacitor C61 but retaining resistor R63 in the charging circuit. If resistor R64 is very much smaller than resistor R63, as assumed herein, the charging time for capacitor C61 is different for different output signal polarities at amplifier 62. If, for example, R64 is 10K and R63 is 200K, the charging period in one direction for C61 is 20 times the charging period in the opposite direction. Charging in each direction of course continues until the triggering point of the Schmitt trigger is reached at which point amplifier 62 changes state and charging in the other direction begins. The output signal from amplifier 62 on the other hand is a rectangular wave having a duty cycle determined by the relative values of R63 and R64. For the configuration illustrated the negative portion of the rectangular wave encompasses significantly smaller portion of the signal period than does the positive portion. The control signal applied to VCO 60 through resistor R61 serves to pre-bias capacitor 61 with an initial charge. Depending upon the level of the control signal, the initial charge on capacitor C61 transposes the input signal to amplifier 62 either closer to or further away from the triggering point of the Schmitt trigger circuit. Since charging is at a constant rate independent of the control voltage, the spread between the initial capacitor charge and the triggering point of amplifier 62 determines the length of the charging interval for capacitor C61. In this manner the control signal from filter 50 changes the period and thus the frequency of the output signal from amplifier 62.

The output signal from VCO 60, which is the output signal from amplifier 62, is applied to bistable circuit 70 where it is split between two input signal paths. The first path includes capacitor C71 and diode D71 connected in series and to the non-inverting input terminal (+) of an operational amplifier 71. The second path includes series connected capacitor C72 and diode D72 connected to the inverting input terminal (−) of amplifier 71. Both diodes D71 and D72 are poled to conduct negative current to the respective input terminals of amplifier 71. The junction between capacitor C71 and diode D71 is coupled to ground via resistor R71; the non-inverting input terminal (+) of amplifier 71 is coupled to ground via resistor R72. A feedback resistor R75 is connected from the output terminal of amplifier 71 to the non-inverting input terminal (+). The inverting input terminal (−) is coupled to ground via resistor R73. Another feedback capacitor R74 is connected from the output terminal of amplifier 71 to the junction between diode D72 and capacitor C72.

In operation, assume that amplifier 71 is initially in its low state wherein it provides a saturated negative output signal. The negative output signal applied to the cathode of diode D72 through resistor R74 forward biases that diode. The negative output signal is also applied to the anode of diode D71 through resistor R75 to back bias D71. The negative bias at the inverting input terminal (−) during this mode is the operational amplifier output signal divided by the ratio of R73/(R73+R74) less the nominal 0.6 volt drop across diode D72. The bias at the non-inverting input terminal during this mode is the operational amplifier output signal divided by the ratio of R72/(R72+R75). This latter bias is larger in magnitude than on the inverting side to provide a net positive or regenerative feedback. This feedback keeps the amplifier in its low state.

A negative pulse applied to circuit 70 momentarily drives diode D72 even heavier into conduction, lowering the voltage at the inverting input terminal to amplifier 71 so that the latter switches to its high state wherein a high positive output voltage is provided. In this state diode D72 is reverse-biased by the feedback through resistor R74, and diode D71 is forward biased slightly by the feedback through resistor R75. The resulting relatively positive voltage at the non-inverting input terminal and relatively negative voltage at the inverting input terminal preserves the high output level until the next pulse appears. At the next negative input pulse diode D71 couples the negative transition to the non-inverting input terminal to once again establish the low state of the operational amplifier.

The bistable circuit described above has its frequency of operation limited only by the operational amplifier. Frequencies in excess of 15KHz are easily obtained using one half of a Motorola Corporation Model MC1437 for amplifier 71. Set and reset of the bistable circuit can be readily effected by providing direct inputs to the operational amplifier as desired. The output voltage swing is basically that of the operational amplifier bias.

Bistable circuit 80 is substantially identical to bistable circuits 70 and like components are designated in a similar manner utilizing the "80" decade for reference numerals instead of the "70" decade.

The connection of bistable circuits 70 and 80 in series acts to reduce the frequency of the output signal of VCO 60 by one quarter so that during lock condition the VCO frequency is nominally four times that of the input signal.

The output signals from bistable circuits 70 and 80 are applied to exclusive OR gate 90 which provides an output signal shifted 90° in phase from the output signal of bistable circuit 80. The use of the bistable circuit 80 and exclusive OR gate 90 to provide a pair of output signals which are shifted by 90° is well known and is described in U.S. Pat. No. 3,369,184 to Zonis.

The output signal from exclusive OR gate 90 is supplied along with the input signal from input terminal 10 to exclusive OR gate 40. Exclusive OR gate 40 operates, in the manner described above for phase detector 20, as a phase detector for the purpose of providing an indication of phase lock for the loop. The output signal from exclusive OR gate 40 is a rectangular wave having a 50% duty cycle when the loop is in phase lock condition. During that condition the two input signals to exclusive OR gate 40 are separated by 90° in phase. The duty cycle of the output signal from circuit 40 varies in proportion to variation of the input signal phase relationship from 90°. The utilization of an exclusive OR gate to detect phase variation between two signals having a nominal phase displacement of 90° is described in detail in my co-pending U.S. Pat. application Ser. No. 53,531, filed July 9, 1970 and entitled "Phase Jitter Meter."

Resistor R1 and capacitor C1 at the output terminal of exclusive OR gate 40 acts as an integrator circuit which provides a DC voltage substantially proportional to the duty cycle of the output signal from circuit 40. When this DC voltage exceeds a predetermined level Schmitt trigger 100 is triggered to actuate logic indicator 101 to indicate that the loop is out of phase lock. When the duty cycle of the output signal from circuit 40 is 50 percent, the DC voltage from the integrator comprising resistor R1 and capacitor C1 is substantially zero, removing the trigger from Schmidt trigger 100 and deactivating logic indicator 101.

Figure 2A:
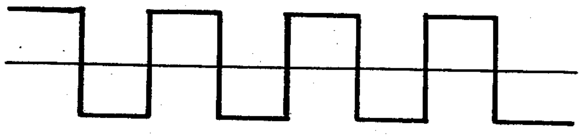
FIGS. 2*a*, 2*b*, 2*c*, 2*d* and 2*e* represent wave shapes of signals appearing at various points in the circuit of FIG. 1.
Figure 2B:
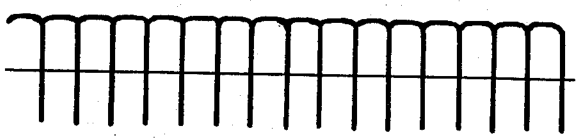
Figure 2C:
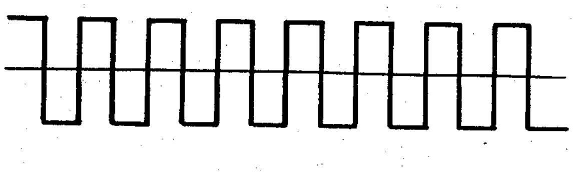
Figure 2D:
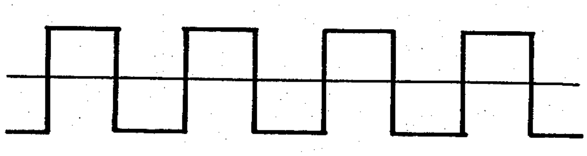
Figure 2E:
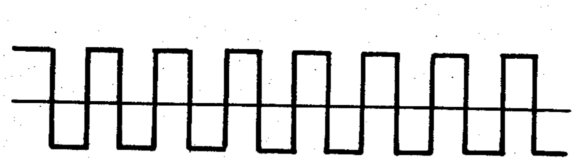

Overall loop operation may now be described in somewhat more detailed terms. The input signal to terminal 10 is assumed to take the form of the rectangular wave shape illustrated in FIG. 2a. If the VCO frequency is something other than four times the input signal frequency, frequency discriminator 30 is operative to provide a control signal proportional to this difference which is smoothed in loop filter 50 and applied to VCO 60 to bring the frequency of the latter closer to four times the input signal frequency. The VCO frequency is divided by four by bistable circuits 70 and 80. When the output signal from circuit 80 is equal to the frequency of the input signal applied to terminal 10 the output signal from frequency discriminator 30 is nulled and phase detector 20 takes over. Under this frequency lock condition the output signal from the VCO, as mentioned above, is at four times the frequency of the input signal. The output signal of the VCO is represented graphically in FIG. 2b. The output signal from frequency divider 70 is represented graphically in FIG. 2c and the output signal from frequency divider 80 is represented graphically in FIG. 2d. The output signal from frequency divider 80 is at the same frequency as the input signal applied to terminal 10. When these two signals are shifted in phase by 90° the output signal from phase detector 20 is nulled and no control voltage is applied to loop filter 50 and in turn to VCO 60. When a phase difference between the two signals applied to phase detector 20 varies from 90°, the duty cycle of the output signal from phase detector 20 varies accordingly. Loop filter 50 acts as a duty cycle-to-DC signal converter for purposes of providing a phase control signal to VCO 60 in response to phase variations at the output of phase detector 20. During phase lock condition the output signal from phase detector 20 is illustrated in FIG. 2e and, as described above, has a 50 percent duty cycle.

Figure 3:
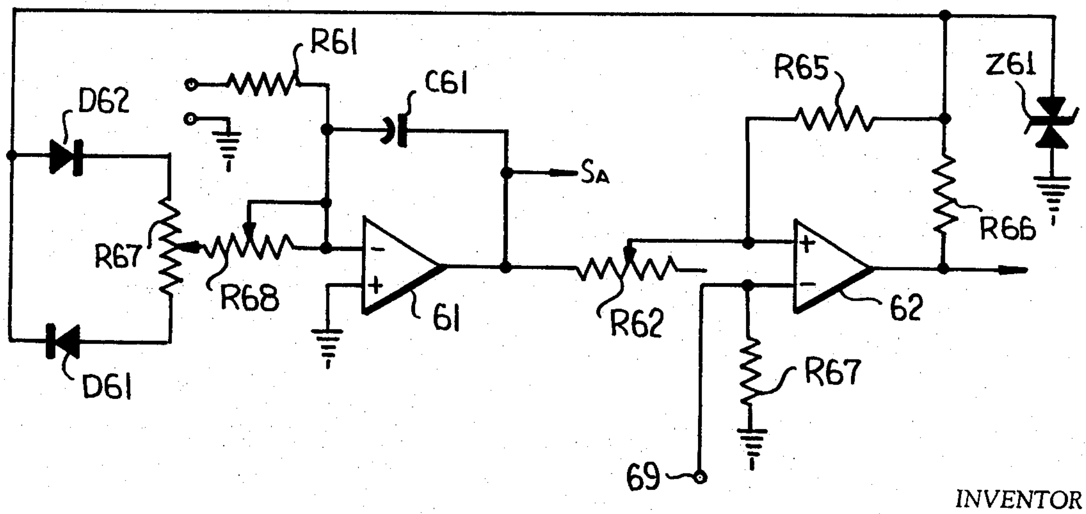
FIG. 3 is a modified version of the VCO circuit illustrated in the loop of FIG. 1.

Referring now to FIG. 3 of the accompanying drawings there is illustrated a modification of the voltage controlled oscillator 60 described in relation to FIG. 1. The circuit of FIG. 3 again includes operational amplifier 61 connected as an inverting integrator with capacitor C61, and operational amplifier 62 which receives its input signal via resistor R62 from amplifier 61. Feedback to the non-inverting input terminal (+) of amplifier 62 is via series resistors R66 and R65, the junction between these resistors being connected to a feedback path to amplifier 61. The latter feedback path includes parallel and oppositely poled diodes D61 connected through variable resistor R61 and variable resistor R68 to the inverting input terminal of amplifier 61. Diodes D61 and D62 control the ratio of positive and negative charging rates of capacitor C61 without altering the frequency by providing a resistance ratio as set by the wiper arm of resistor R67. Resistor R68 may be employed to change the frequency of the VCO. Thus resistor R67 controls the duty cycle of the VCO by changing the proportion of R67 in the charge path for each direction of charge of capacitor C61. Resistor R68 changes the frequency of the VCO by changing the overall resistance in series with charging capacitor C61 to thereby change the rate at which C61 charges.

Another interesting feature of the circuit is the fact that if resistor R62 is large enough to prevent the charging voltage from reaching the triggering point of the Schmitt trigger, the circuit becomes bistable and is independently triggerable by applying pulses directly to amplifier 62 via input terminal 69.

If diodes D61 and D62 and potentiometer R67 are eliminated entirely, replaced by a short circuit from R68 to the feedback path from the junction of resistors R65 and R66, it is found that a highly symmetrical wave is generated in the absence of a VCO control voltage input signal. Also of interest is the fact when R67 is set at its center point, the output signal from amplifier 61 is a triangular wave having equal charging intervals in both directions. Moreover application of a control signal through R61 acts to vary the frequency of the circuit as a function of the square of the control voltage. Measurements made on the constructed embodiment of the circuit have shown excellent square law behavior in this regard. It is only when the two diode arrangement is replaced by the arrangement illustrated in FIG. 1, including diode D61 and resistors R63 and R64, that linear frequency versus input control voltage characteristics are obtained.

Typical component values not intended to be limiting on the scope of the present invention, are listed below in the following table.

TABLE OF TYPICAL COMPONENT VALUES

| | |
|---|---|
| R21 | 10K |
| R23 | 10K |
| R41 | 10K |
| R43 | 10K |
| R91 | 10K |
| R93 | 10K |
| R71 | 10K |
| R72 | 10K |
| R64 | 10K |
| R2 | 10K |
| R81 | 10K |
| R82 | 10K |
| R22 | 100K |
| R24 | 100K |
| R25 | 100K |
| R42 | 100K |
| R44 | 100K |
| R45 | 100K |
| R92 | 100K |
| R94 | 100K |
| R95 | 100K |
| R74 | 100K |
| R84 | 100K |
| R53 | 100K |
| R31 | 100K |
| R32 | 4.7K |
| R73 | 4.7K |
| R83 | 4.7K |
| R62 | 4.7K |
| R61 | 300K |
| R52 | 300K |
| R63 | 200K |
| R65 | 20K |
| R51 | 15K K |
| R75 | 51K |
| R85 | 51K |
| R33 | 390K |
| C71 | 560uuf |
| C72 | 560uuf |
| C81 | 560uuf |
| C82 | 560uuf |
| C61 | 0.0015uf |
| C31 | 0.001uf |
| C32 | 0.001uf |
| C33 | 0.15uf |
| operational amplifiers 21, 41, 62, 71, 81, 91 | MC1437 |
| operational amplifiers 31, 51, 61 | MC1458 |

While I have described and illustrated specific embodiments of my invention, it will be clear that variations of the details of construction which are specifically illustrated and described may be resorted to without departing from the true spirit and scope of the invention as defined in the appended claims.

I claim:

1. A circuit for generating an output signal having a constant phase relationship with an input signal, said input signal being of the type which exhibits both frequency and phase variations, said circuit comprising:

voltage controlled oscillator means for providing said output signal at a frequency which is a predetermined function of the amplitude of a control signal applied thereto;

phase detector means for providing a first signal at an amplitude which varies as a function of the phase difference between said input signal and said output signal;

a frequency discriminator for receiving said input signal and said output signal and for providing a second signal at an amplitude which varies in proportion to the frequency difference between said input and output signals, said frequency discriminator comprising: a storage capacitor, first and second coupling capacitors for receiving said input and output signals respectively, first gating means connected between said first coupling capacitor and said storage capacitor for providing a charging path for said first coupling capacitor during half cycles of one polarity of said input signal and for providing a transfer path for transferring charge from said first coupling capacitor to said storage capacitor during half cycles of a second polarity of said input signal, and second gating means connected between said second coupling capacitor and said storage capacitor for providing a charging path for said second coupling capacitor during half cycles of said second polarity of said output signal and for providing a transfer path for transferring charge from said second coupling capacitor to said storage capacitor during half cycles of said one polarity of said output signal; and means for summing said first and second signals to provide said control signal for controlling the frequency of said voltage controlled oscillator.

2. The circuit according to claim 1 wherein the capacitance of said storage capacitor is at least five times the capacitance of said first and second coupling capacitors.

3. The circuit according to claim 2 wherein said frequency discriminator further comprises an operational amplifier having an input terminal and an output terminal, wherein said storage capacitor is connected between said output terminal and said input terminal, wherein said first gating means is connected between said first coupling capacitor and said input terminal, and wherein said second gating means is connected between said second coupling capacitor and said input terminal.

4. The circuit according to claim 3 further comprising a resistor connected in parallel with said storage capacitor, the time constant provided by said resistor and said storage capacitor being large relative to the period of said input signal over the frequency range of said input signal.

5. The circuit according to claim 3:

wherein said first gating means includes a first diode connected between said first coupling capacitor and ground to permit said input signal to charge said first coupling capacitor during said one polarity of said input signal, and a second diode connected between said first coupling capacitor and said input terminal of said operational amplifier to permit charge transfer from said first coupling capacitor to said storage capacitor during half cycles of said second polarity of said input signal; and wherein said second gating means includes a third diode connected between said second coupling capacitor and ground to provide a charging path for said second coupling capacitor during half cycles of said second polarity of said output signal, and a fourth diode connected between said second coupling capacitor and said input terminal of said operational amplifier for providing a path for transferring charge from said second coupling capacitor to said storage capacitor during half cycles of said one polarity of said one output signal.

6. The circuit according to claim 1 wherein said voltage controlled oscillator includes:

an integrator comprising an operational amplifier having an inverting input terminal and an output terminal, and a feedback capacitor connected between said inverting input terminal and said output terminal;

a Schmitt trigger comprising an operational amplifier and means for biasing said last mentioned operational amplifier to provide a Schmitt trigger output signal at one polarity when the output signal from said integrator is below a predetermined level and for providing a Schmitt trigger output signal at a second polarity when the output signal from said integrator is above said predetermined level;

feedback means for coupling the Schmitt trigger output signal to the input terminal of said integrator, said feedback means including a first feedback path which is operative to connect said Schmitt trigger output signal of one polarity to the input terminal of said integrator but is inoperative to connect said Schmitt trigger output signal of a second polarity to the input terminal of said integrator, and a second feedback path operative to couple said Schmitt trigger output signal of said second polarity to said input terminal of said integrator.

7. The circuit according to claim 6 wherein said first feedback path includes a diode in series with a first resistor of relatively low resistance, and wherein said second feedback path includes a second resistor of relatively high resistance, said first and second feedback paths being connected in parallel.

8. The circuit according to claim 1 wherein said phase detector comprises: an exclusive OR gate which receives both said input and output signals.

9. The circuit according to claim 8 wherein said exclusive OR gate comprises an operational amplifier having a non-inverting input terminal, an inverting input terminal, and an output terminal;

a first diode having its cathode connected to said non-inverting input terminal;

a second diode having its anode connected to said inverting input terminal;

a common junction;

means coupling the anode of said first diode and cathode of said second diode to said common junction; and means coupling said input and output signals to said common junction.

10. The circuit according to claim 7 wherein said voltage controlled oscillator includes a bistable circuit for dividing the frequency of said Schmitt trigger output signal by two, said bistable circuit comprising:

an operational amplifier having a non-inverting input terminal, an inverting input terminal and an output terminal;

a first input signal path for conducting said Schmitt trigger output signal to said non-inverting input terminal, said first input path comprising a first capacitor and first diode connected in series, said first diode being connected to conduct negative current to said non-inverting input terminal;

a second signal path for conducting said Schmitt trigger input signal to said inverting input terminal, said second signal path comprising a second capacitor and second diode connected in series with said inverting input terminal, said second diode being poled to conduct negative current to said inverting input terminal;

a resistive positive feedback path connected between said output terminal and said non-inverting input terminal of said operational amplifier;

a negative feedback path connected between said output terminal of said operational amplifier and the cathode of said second diode;

and resistive bias means connected between ground and each of said inverting and non-inverting input terminals of said operational amplifier.

* * * * *